US009135994B2

(12) United States Patent
Kwon et al.

(10) Patent No.: US 9,135,994 B2
(45) Date of Patent: Sep. 15, 2015

(54) NONVOLATILE MEMORY DEVICE HAVING READ CIRCUITS FOR PERFORMING READ-WHILE-WRITE (RWW) OPERATION AND READ-MODIFY-WRITE (RMW) OPERATION

(71) Applicant: SAMSUNG ELECTRONICS CO., LTD., Suwon-si, Gyeonggi-do (KR)

(72) Inventors: Hyo-Jin Kwon, Seoul (KR); Hoi-Ju Chung, Yongin-si (KR); Chae-Hoon Kim, Hwaseong-si (KR); Yong-Jin Kwon, Suwon-si (KR); Eun-Hye Park, Iksan-si (KR); Yong-Jun Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 14/171,873

(22) Filed: Feb. 4, 2014

(65) Prior Publication Data

US 2014/0247646 A1    Sep. 4, 2014

(30) Foreign Application Priority Data

Mar. 4, 2013  (KR) .......................... 10-2013-0023007

(51) Int. Cl.
G11C 7/22      (2006.01)
G11C 13/00    (2006.01)

(52) U.S. Cl.
CPC .......... *G11C 13/004* (2013.01); *G11C 13/0061* (2013.01); *G11C 13/0002* (2013.01); *G11C 13/0004* (2013.01); *G11C 2213/72* (2013.01)

(58) Field of Classification Search
CPC ............... G11C 7/1042; G11C 13/004; G11C 13/0069; G11C 2207/2209; G11C 2207/2263

USPC .......... 365/148, 163, 189.15, 189.04, 189.05, 365/189.07, 190, 203, 233.16, 233.17, 365/233.19, 194, 206
See application file for complete search history.

(56) References Cited

U.S. PATENT DOCUMENTS

| 4,849,937 | A | * | 7/1989 | Yoshimoto ............... 365/189.05 |
| 5,473,570 | A | | 12/1995 | Sato et al. |
| 5,666,322 | A | * | 9/1997 | Conkle .................... 365/230.03 |
| 5,802,587 | A | | 9/1998 | Ishikawa et al. |
| 6,850,441 | B2 | | 2/2005 | Mokhlesi et al. |
| 7,490,283 | B2 | | 2/2009 | Gorobets et al. |
| 7,929,337 | B2 | | 4/2011 | Choi et al. |
| 8,102,704 | B2 | | 1/2012 | Lee et al. |
| 8,139,432 | B2 | * | 3/2012 | Choi et al. ..................... 365/211 |
| 8,583,987 | B2 | * | 11/2013 | Mirichigni .................... 714/763 |

FOREIGN PATENT DOCUMENTS

| JP | 2010-182375 | 8/2010 |
| KR | 2007-0114964 A | 12/2007 |
| KR | 2012-0077521 A | 7/2012 |

* cited by examiner

*Primary Examiner* — Andrew Q Tran
(74) *Attorney, Agent, or Firm* — Volentine & Whitt, PLLC

(57) ABSTRACT

A nonvolatile memory device includes a memory array having multiple nonvolatile memory cells, a first read circuit and a second read circuit. The first read circuit is configured to read first data from the memory array during a first read operation and to provide one or more protection signals indicating a victim period during the first read operation. The second read circuit is configured to read second data from the memory array during a second read operation and to provide one or more check signals indicating an aggressor period during the second read operation.

20 Claims, 7 Drawing Sheets

1

NONVOLATILE MEMORY DEVICE HAVING READ CIRCUITS FOR PERFORMING READ-WHILE-WRITE (RWW) OPERATION AND READ-MODIFY-WRITE (RMW) OPERATION

CROSS-REFERENCE TO RELATED APPLICATION

A claim for priority under 35 U.S.C. §119 is made to Korean Patent Application No. 10-2013-0023007, filed on Mar. 4, 2013, in the Korean Intellectual Property Office, the entire contents of which are hereby incorporated by reference.

BACKGROUND

Nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material, such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

For example, in a phase-change memory device, a phase-change material is changed into a crystalline state or an amorphous state while being heated and then cooled. The phase-change material typically exhibits a relatively low resistance in the crystalline state, which is typically defined as "set" data, and a relatively high resistance in the amorphous state, which is typically defined as "reset" data.

SUMMARY

Embodiments of the inventive concept relate to nonvolatile memory devices using variable resistive elements. Embodiments of the inventive concept provide a nonvolatile memory device having improved reliability of a read operation. The above and other objects will be described in or be apparent from the following description.

According to an aspect of the inventive concept, there is provided a nonvolatile memory device including a memory array having multiple nonvolatile memory cells, a first read circuit and a second read circuit. The first read circuit is configured to read first data from the memory array during a first read operation and to provide one or more protection signals indicating a victim period during the first read operation. The second read circuit is configured to read second data from the memory array during a second read operation and to provide one or more check signals indicating an aggressor period during the second read operation.

According to another aspect of the inventive concept, there is provided a nonvolatile memory device including a memory array having multiple nonvolatile memory cells, a first read circuit and a second read circuit. The first read circuit is configured to read first data from the memory array to perform a read while write (RWW) operation. The second read circuit is configured to read second data from the memory array to perform a read modification write (RMW) operation. The second read circuit stops the RMW operation while the first read circuit performs one of a bitline precharge of the RWW operation, a sense amplifier operation start, and a data dump.

According to another aspect of the inventive concept, there is a nonvolatile memory including first and second read circuits. The first read circuit is configured to read first data from memory cells having variable resistive materials during a first read operation and to generate at least one protection signal indicating a victim period during the first read operation. The first read circuit includes a first precharge circuit for precharging a sensing node electrically connected to a memory cell to a predetermined level during a bitline precharge period, a first sense amplifier for comparing levels of the sensing node and a set reference voltage, the first sense amplifier being enabled by a first sense amplifier control signal, and a first multiplexer for outputting an output signal of the first sense amplifier as data, the first multiplexer being enabled by a first multiplexer control signal. The victim period includes at least one of a portion of the bitline precharge period, activation of the sense amplifier control signal, and a portion of a data dump period activated in response to the first multiplexer control signal. The second read circuit is configured to read second data from the memory cells having variable resistive materials during a second read operation and to generate at least one check signal indicating an aggressor period during the second read operation. The second read circuit includes a second sense amplifier for comparing levels of a sensing node and a set reference voltage, the second sense amplifier being enabled by a second sense amplifier control signal, and a second multiplexer for outputting an output signal of the second sense amplifier as data, the second multiplexer being enabled by a second multiplexer control signal. The aggressor period includes at least one of first noise generated at an operation start time of the second sense amplifier, second noise generated at an operation start time of the second multiplexer, and third noise generated during a data dump period activated in response to the second multiplexer control signal.

BRIEF DESCRIPTION OF THE DRAWINGS

The above and other features and advantages will become apparent from the following description with reference to the following figures, in which.

DETAILED DESCRIPTION OF EMBODIMENTS

Figure 1:
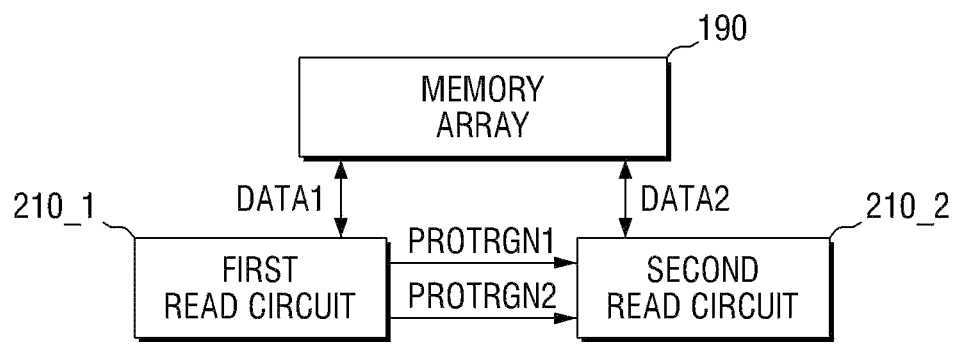
FIG. 1 is a block diagram of a nonvolatile memory device, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the figures, the sizes and relative sizes of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "exemplary" refers to an example or illustration.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Exemplary embodiments of the inventive concept will hereinafter be described in detail, using a phase-change random access memory (PRAM) device as an example. However, embodiments of the inventive concept are not restricted to PRAM devices. That is, embodiments may also be applied to other nonvolatile memory devices using resistance materials including, for example, a resistive random access memory (RRAM) device, a ferroelectric random access memory (FRAM) device, and the like.

Figure 2:
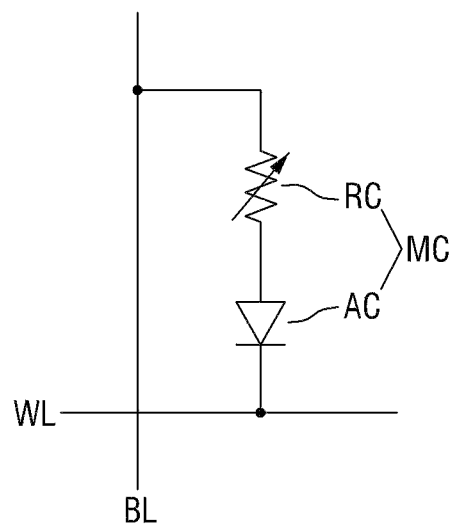
FIG. 2 is a circuit diagram illustrating a nonvolatile memory cell in the memory array shown in FIG. 1, according to an embodiment of the inventive concept.

FIG. 1 is a block diagram of a nonvolatile memory device, according to embodiments of the inventive concept. FIG. 2 is a circuit diagram illustrating a nonvolatile memory cell in the memory array shown in FIG. 1, according to an embodiment of the inventive concept.

Referring to FIG. 1, nonvolatile memory device 1 includes a memory array 190, a first read circuit 210_1 and a second read circuit 210_2.

The memory array 190 may include multiple nonvolatile memory cells (e.g., MCs in FIG. 2). The nonvolatile MCs may write or read data using a resistance material. Each of the nonvolatile MCs includes a variable resistive circuit (RC), including a phase change material having different resistance values according to the data stored, and an access circuit (AC) controlling current flowing into the AC. The ACs may include diodes, transistors, and the like, coupled to the RCs in series. In the embodiment shown in FIG. 2, a diode is used as the AC. GeSbTe, which is a combination of germanium (Ge), antimony (Sb) and tellurium (Te), may be used as the phase change material, although other phase change material may be incorporated. For example, the phase change material may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$.

The first read circuit 210_1 performs a first read operation on first data DATA1 from the memory array 190. For example, the first read circuit 210_1 may perform a read while write (RWW) operation. The first read circuit 210_1 is used in a normal read operation.

In the RWW operation, a read operation is performed while a write operation is performed. For example, a write operation may be performed in a region and a read operation may be performed in another region at substantially the same time. Hereinafter, a read command input during the RWW operation is referred to as an "RWW read command" and a read operation performed during the RWW operation is referred to as "RWW read." The RWW read command is the same as a normal read command except that it is input during a write operation.

The second read circuit 210_2 performs a second read operation on second data DATA2 from the memory array 190. For example, the second read circuit 210_2 may read the second data DATA2 during a read modification write (RMW) operation.

In the RMW operation, the data stored in the memory array 190 is read, the read data and data to be written are compared with each other, and only bits of the data to be written that are different from bits of the read data are written. That is, in an RMW operation, a read operation is performed prior to a write operation. Hereinafter, a read command input during the RMW operation is referred to as an "RMW read command" and a read operation performed during the RMW operation is referred to as "RMW read."

Meanwhile, in the nonvolatile memory device 1 according to various embodiments, the first read circuit 210_1 generates one or more protection signals PROTRGN1 and PROTRGN2 corresponding to a "victim period" during the first read operation. In FIG. 1, two protection signals PROTRGN1 and PROTRGN2 are shown for purposes of explanation, although various aspects of the inventive concept are not limited thereto.

The "victim period" refers to a period vulnerable to changes in the bias (e.g., voltage) during a read operation. As described below with reference to FIG. 4, the read operation may be performed in order of bitline discharge, bitline precharge, develop, data sensing by a sense amplifier, and data dump to a peripheral region, although aspects of the inventive concept are not limited thereto.

In the read operation, the victim period may include, for example, at least a portion of a bitline precharge period of the first read circuit 210_1, a period including an operation start time of the sense amplifier of the first read circuit 210_1, and a data dump period of the first read circuit 210_1. The victim period may be determined through simulation and/or experimentation, and may vary according to specific requirements and/or configurations.

The second read circuit 210_2 generates one or more check signals corresponding to an "aggressor period" during the second read operation. The "aggressor period" refers to a period during which considerable changes in the bias (e.g., voltage) may be caused during a read operation. In other words, the aggressor period is a period in which noise may be generated. For example, a current peak may be generated in the aggressor period.

The aggressor period in the read operation may include, for example, an operation start time of the sense amplifier of the second read circuit 210_2, an operation start time of the MUX of the second read circuit 210_2, and a data dump period of the second read circuit 210_2. The aggressor period may be determined through simulation and/or experimentation and may vary according to specific requirements and/or configurations.

The second read circuit 210_2 checks whether the protection signals PROTRGN1 and PROTRGN2 supplied from the first read circuit 210_1 overlap with the one or more check signals. If the protection signals PROTRGN1 and PROTRGN2 do overlap with the one or more check signals, the second read circuit 210_2 stops the second read operation. If it is determined using the one or more check signals that the protection signals PROTRGN1 and PROTRGN2 are inactivated (or if the protection signals PROTRGN1 and PROTRGN2 do not overlap with the one or more check signals), the second read circuit 210_2 resumes the second read operation. Here, it will be understood that when the protection signals PROTRGN1 and PROTRGN2 overlap with the one or more check signals, the first read operation of the first read circuit 210_1 may be in a victim period and the second read operation of the second read circuit 210_2 may be in an aggressor period. That is, the first read operation may be adversely affected by the second read operation. Therefore, the second read operation is stopped, thereby ensuring reliability of the first read operation.

That is, a RMW read (i.e., a read performed in the second read circuit 210_2) may be controlled according to the progress of the RWW read (i.e., a read performed in the first read circuit 210_1). A read operation is controlled so as not to simultaneously perform two types of reads in a period in which reliability of a read operation is difficult to attain.

In the above-described embodiment, the RMW read is controlled according to the progress of the RWW read, although aspects of the inventive concept are not limited thereto. That is, the RWW read may be controlled according to the progress of the RMW read. In particular, each of the RWW read and the RMW read has an aggressor period and a victim period. Therefore, it is optional to first perform the RWW read to then control the progress the RMW read, or to first perform the RMW read to then control the progress the RWW read. The order may be chosen based on various factors, such as specifications, timing, and so on.

Hereinafter, an exemplary first read circuit 210_1 (and second read circuit 210_2) is described with reference to FIG. 3, and timing diagram corresponding to a method of operating the first read circuit 210_1 (and the second read circuit 210_2), including the victim period and the aggressor period, are described with reference to FIG. 4. Also, a process of matching protection signals to check signals are described with reference to FIGS. 5 to 9, a process of choosing the protection signals is described with reference to FIG. 10, and an exemplary circuit for matching the protection signals to the check signals is described with reference to FIG. 11.

Figure 3:
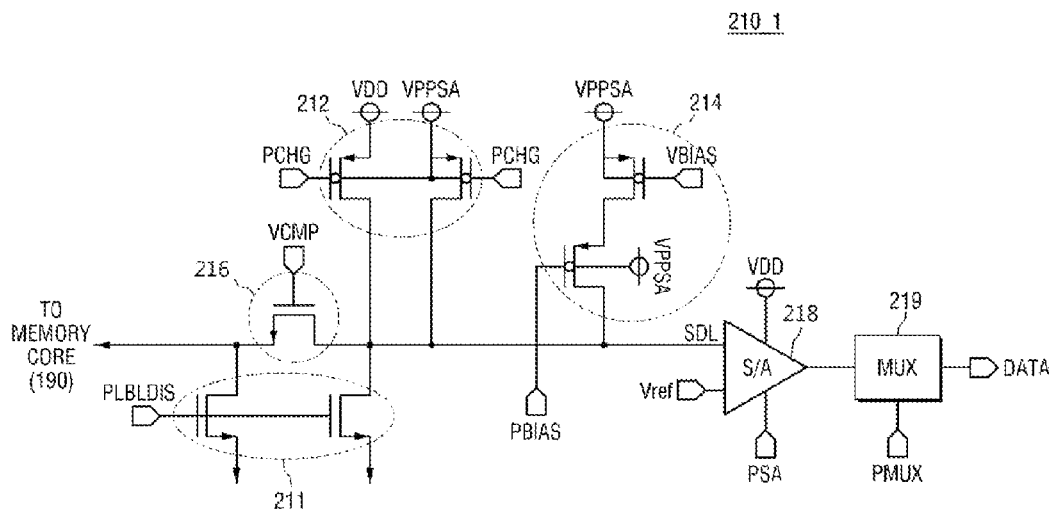
FIG. 3 is a circuit diagram of an exemplary first read circuit shown in FIG. 1, according to an embodiment of the inventive concept.

FIG. 3 is a circuit diagram of an exemplary first read circuit shown in FIG. 1, according to an embodiment. The depicted first read circuit is provided for purposes of illustration, and aspects of the inventive concept are not limited thereto.

Referring to FIG. 3, the first read circuit 210_1 includes a first discharge unit 211, a first precharge unit 212, a first compensation unit 214, a first clamping unit 216, a first sense amplifier (AMP) 218, and a first multiplexer (MUX) 219.

The first discharge unit 211 discharges a bit line (i.e., a sensing node) electrically connected to the nonvolatile MC. The first discharge unit 211 may include an NMOS transistor, for example, controlled by a discharge control signal PLBL-DIS.

The first precharge unit 212 precharges a sensing node to a predetermined level, for example, a power supply voltage VDD or a step-up voltage VPPSA, during a precharge period, preceded by a develop operation. The first precharge unit 212 may include a PMOS transistor with a source connected to the power supply voltage VDD or the step-up voltage VPPSA, for example, and controlled by a precharge control signal PCHG.

In order to compensate for a reduction in the level of a sensing node generated by penetration current Icell flowing through the selected nonvolatile memory cell (MC of FIG. 2), the first compensation unit 214 supplies a compensation current to the sensing node. More particularly, when a nonvolatile memory cell is in a SET state, the resistance of the phase change material may be small, so the amount of penetration current Icell is large. When a nonvolatile memory cell is in a RESET state, the resistance of the phase change material may be large, so the amount of penetration current Icell is small. The amount of the compensation current supplied from the first compensation unit 214 compensates for the penetration current Icell in the RESET state. In this case, a level of the sensing node in the SET state is reduced while a level of the sensing node in the RESET state is maintained constant. Thus, the difference between the level of sensing node in the RESET state and the level of sensing node in the SET state may be relatively large, making it easier to distinguish between the SET state and the RESET state. By doing so, a sensing margin may be increased. The first compensation unit 214 may include a PMOS transistor controlled by a compensation control signal PBIAS and a PMOS transistor controlled by a voltage signal VBIAS, for example.

The first clamping unit 216 clamps a level of the bit line BL coupled to the selected nonvolatile memory cell within a proper range to read. In detail, the first clamping unit 216 clamps the level of bit line BL to a predetermined level lower than a critical voltage of the phase change material. This is because, if the level of the bit line BL is equal to or higher than the critical voltage, the phase of the phase change material of the selected phase change memory cell may be changed. The first clamping unit 216 may include an NMOS transistor, for example, controlled by a clamping control signal VCMP.

The first sense AMP 218 compares a level of the sensing node and a set reference voltage Vref, and outputs results of the comparison to an output terminal. The first sense AMP 218 may be a current sense amplifier or a voltage sense amplifier. The first sense AMP 218 may be enabled by a sense amplifier control signal PSA.

The first MUX 219 outputs an output signal of the first sense AMP 218 as data. The first MUX 219 may be enabled by a MUX control signal PMUX.

The second read circuit 210_2 (not shown) may have substantially the same circuit configuration as that of the first read circuit 210_1, discussed above. That is, the second read circuit 210_2 may include a second discharge unit, a second precharge unit, a second compensation unit, a second clamping unit, a second sense AMP, and a second MUX.

Figure 4:
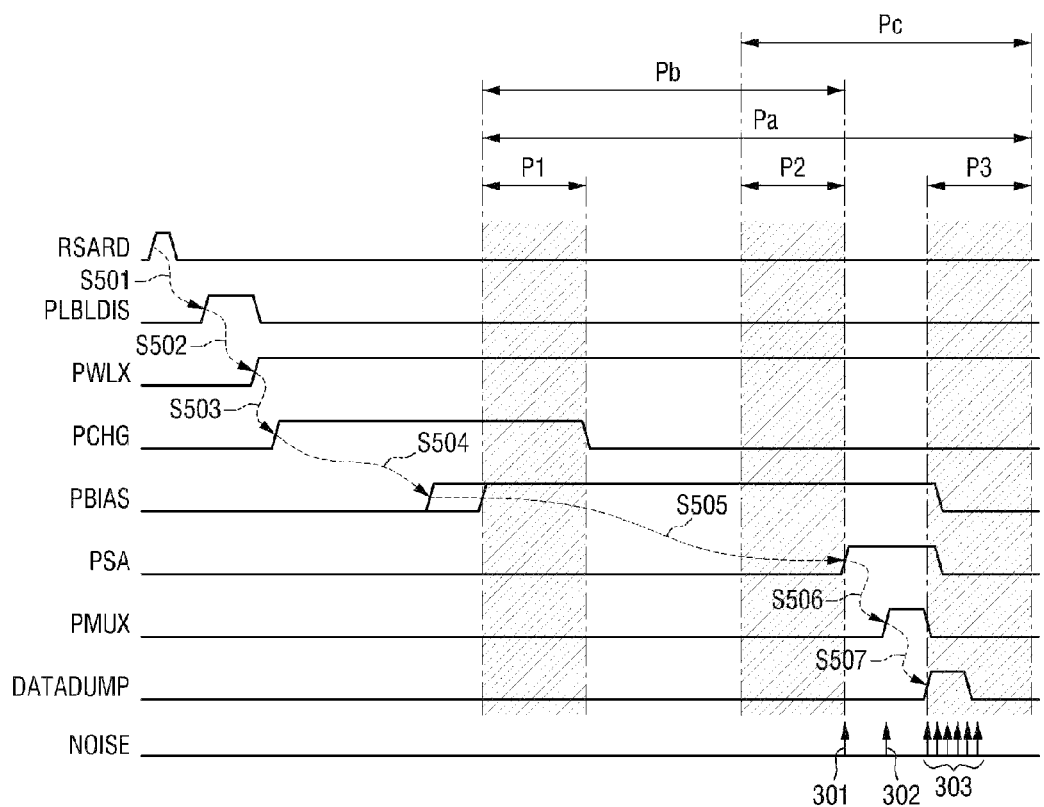
FIG. 4 is a timing diagram showing an exemplary method of operating the first read circuit, including a victim period and an aggressor period, according to an embodiment of the inventive concept.

FIG. 4 is a timing diagram showing an exemplary method of operating the first read circuit, according to an embodiment of the inventive concept.

Referring to FIG. 4, a core read start signal RSARD is an internal command to start a core read operation. The discharge control signal PLBLDIS is activated in response to the core read start signal RSARD (S501). As described above, the discharge control signal PLBLDIS controls the first discharge unit 211 of the first read circuit (210_1 of FIG. 3). A word line select signal PWLX is activated in response to the discharge control signal PLBLDIS (S502). The precharge control signal PCHG is activated in response to the word line select signal PWLX (S503). As described above, the precharge control signal PCHG controls the first precharge unit 212 of the first read circuit (210_1 of FIG. 3).

The compensation control signal PBIAS is activated in response to the precharge control signal PCHG (S504). As described above, the compensation control signal PBIAS controls the first compensation unit 214 of the first read circuit (210_1 of FIG. 3).

The sense AMP control signal PSA is activated in response to the compensation control signal PBIAS (S505). As described above, the sense AMP control signal PSA controls the first sense AMP 218 of the first read circuit (210_1 of FIG. 3).

The MUX control signal PMUX is activated in response to the sense AMP control signal PSA (S506). As described above, the MUX control signal PMUX controls the first MUX 219 of the first read circuit (210_1 of FIG. 3).

A data dump signal DATADUMP is activated in response to the MUX control signal PMUX (S507). The data dump signal DATADUMP is a signal for transmitting data to a peripheral region.

As described above, an aggressor period during a read operation may be a period in which noise is generated. First noise 301 is generated at the operation start time of a sense AMP (e.g., at a rising edge of the sense AMP control signal PSA), second noise 302 is generated at the operation start time of a MUX (e.g., at a rising edge of the MUX control signal PMUX), and third noise 303 is generated during the data dump period (e.g., an active period of the data dump signal DATADUMP). One or more check signals (CHK1, CHK2 and CHK3, described below) may be generated in such noise generated periods.

Meanwhile, the victim period during a read operation may include, for example, period P1 including at least a portion of a bitline precharge period (e.g., a portion of an active period of the precharge control signal PCHG), period P2 including sense AMP operation start time (e.g., a rising edge of the sense AMP control signal PSA), and period P3 including at least a portion of a data dump period (e.g., an active period of the data dump signal DATADUMP).

In addition, to accommodate convenient control, the victim period may be set as period Pa, including period P1, period P2 and period P3. Alternatively, the victim period may be set as period Pb, including period P1 and period P2. Alternatively, the victim period may be set as period Pc, including period P2 and period P3. One or more protection signals (PROTRGN1 and PROTRGN2, described below) may be generated to indicate the victim periods defined as above.

FIGS. 5 to 9 are conceptual diagrams for explaining methods for matching protection signals to check signals.

Figure 5:
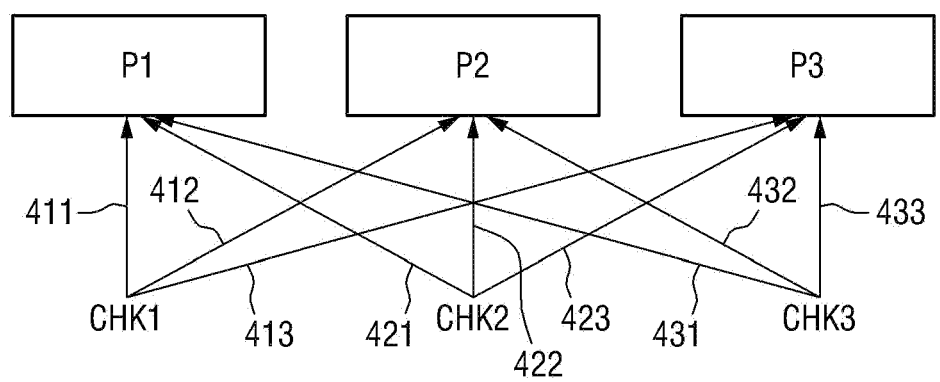
FIGS. 5 to 9 are conceptual diagrams for explaining a method for matching protection signals to check signals, according to embodiments of the inventive concept.

Referring to FIG. 5, as described above, it is assumed that a first read operation has three victim periods P1, P2 and P3 corresponding to the protection signals. Also, a second read operation has an aggressor period (noise generating period), where three check signals CHK1, CHK2 and CHK3 correspond to the aggressor period.

It is checked whether the check signal CHK1 is overlapped (or matched) with all of the victim periods P1, P2 and P3 (411, 412 and 413). It is checked whether the check signal CHK2 is overlapped (or matched) with all of the victim periods P1, P2 and P3 (421, 422 and 423). It is checked whether the check signal CHK3 is overlapped (or matched) with all of the victim periods P1, P2 and P3 (431, 432 and 433). When any one check signal (e.g., CHK1) of the check signals is overlapped with the victim periods P1, P2 and P3, the second read operation may be stopped until the first read operation is completed.

Figure 6:
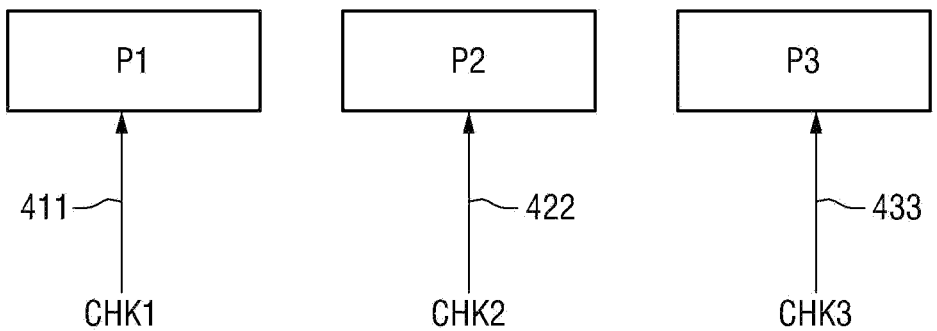

Referring to FIG. 6, it is checked whether the check signal CHK1 is overlapped with one victim period P1 (411), whether the check signal CHK2 is overlapped with one victim period P2 (422) and whether the check signal CHK3 is overlapped with one victim period P3 (433). When any one check signal (e.g., CHK1) of the check signals is overlapped with a corresponding one of the victim periods P1, P2 and P3, the second read operation may be stopped until the first read operation is completed.

Figure 7:
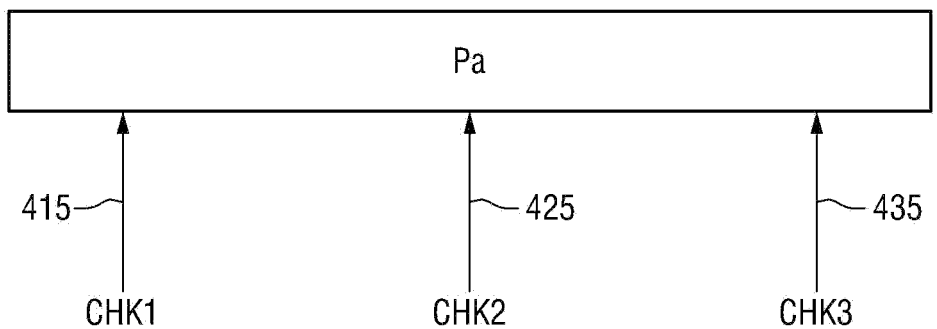

Referring to FIG. 7, the first read operation has a victim period Pa including all of the victim periods P1, P2 and P3. To accommodate convenient control, the victim period may be set as the period Pa including period P1, period P2 and period P3. It is checked whether the check signals CHK1, CHK2 and CHK3 are overlapped (or matched) with the victim period Pa (415, 425 and 435).

Figure 8:
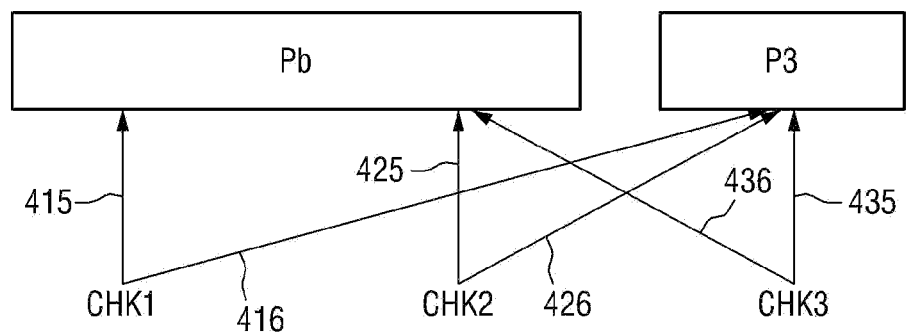

Referring to FIG. 8, the first read operation has a victim period Pb including victim periods P1 and P2. To accommodate convenient control, the victim period may be set as the period Pb including period P1 and period P2. It is checked whether the check signals CHK1 and CHK2 are overlapped (or matched) with the victim periods Pb and P3 (415, 416, 425 and 426). That is, it is checked whether the check signal CHK1 is overlapped with the victim periods Pb and P3 (415 and 416), whether the check signal CHK2 is overlapped with the victim periods Pb and P3 (425 and 426) and/or whether the check signal CHK3 is overlapped with the victim periods P3 and Pb (435 and 436).

Figure 9:
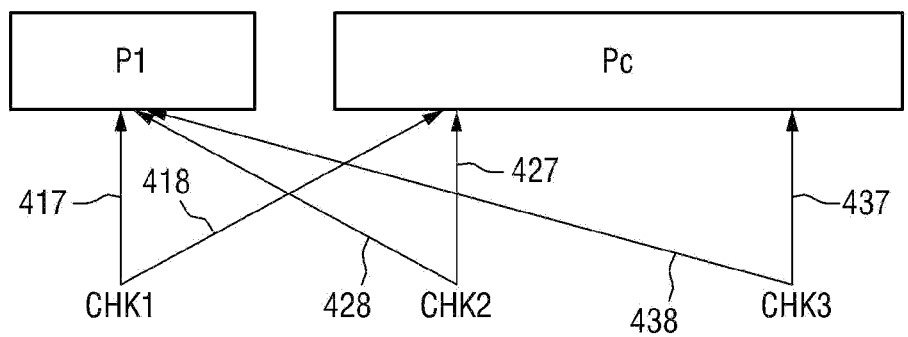

Referring to FIG. 9, the first read operation has a victim period Pc including victim periods P2 and P3. To accommodate convenient control, the victim period may be set as the period Pc including period P2 and period P3. It is checked whether the check signals CHK2 and CHK3 are overlapped (or matched) with the victim periods P1 and Pc (427, 428, 437 and 438). That is, it is checked whether the check signal CHK1 is overlapped with the victim periods P1 and Pc (417 and 418), whether the check signal CHK2 is overlapped with the victim periods Pc and P1 (427 and 428) and/or whether the check signal CHK3 is overlapped with the victim periods Pc and P3 (437 and 438).

Figure 10:
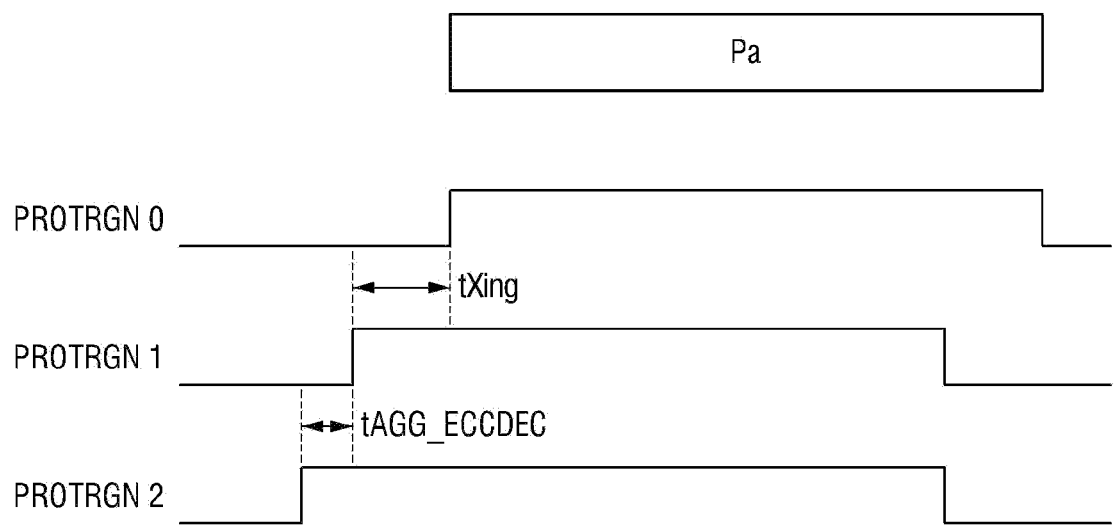
FIG. 10 is a timing diagram illustrating an exemplary process of choosing protection signals, according to an embodiment of the inventive concept.

FIG. 10 is a timing diagram illustrating an exemplary process of choosing protection signals, according to an embodiment of the inventive concept.

Referring to FIG. 10, a first read operation may have, for example, a victim period Pa including all of victim periods P1, P2 and P3. A protection signal PROTRGN0 may correspond to the victim period Pa. However, in the nonvolatile memory device 1 according an embodiment of the inventive concept, a first protection signal PROTRGN1 may be used in consideration of tXing, which represents time required to address with metastability problems. Therefore, the first protection signal PROTRGN1 is activated earlier than PROTRGN0 by the time tXing.

In addition, in the nonvolatile memory device 1, according to an embodiment of the inventive concept, a second protection signal PROTRGN2 may be used in consideration of tAGG_ECCDEC, which represents time required for operating an error correcting code (ECC) decoder of a second read circuit. The time tAGG_ECCDEC may be substantially the same as a data dump period, discussed above.

As described above with reference to FIG. 4, the data dump period is longer than periods of the other noise (e.g., the operation start time of the sense AMP or the operation start time of the MUX). Therefore, the second protection signal PROTRGN2 is set longer than the first protection signal PROTRGN1 by the data dump period. In such a manner, aggression, which may occur around the start portion of the victim period Pa due to a data dump, can be prevented.

Figure 11:
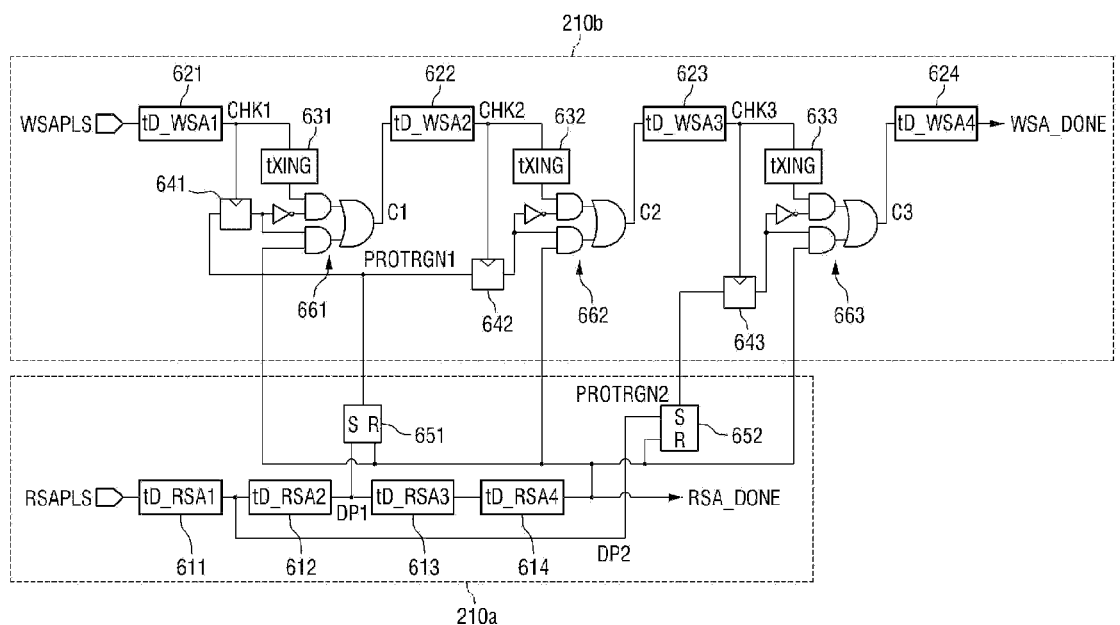
FIG. 11 is an exemplary circuit view illustrating generation and matching of protection signals and check signals, according to an embodiment of the inventive concept.

FIG. 11 is a circuit diagram illustrating generating and matching protection signals and check signals, according to an embodiment of the inventive concept.

Referring to FIG. 11, a protection signal generator 210a is positioned in a first read circuit 210_1, and a check signal generator 210b is positioned in a second read circuit 210_2.

The protection signal generator 210a includes multiple delay units 611, 612, 613 and 614, a first SR latch 651, and a second SR latch 652. A first pulse RSAPLS formed based on an RWW read command is input to the protection signal generator 210a, and a first termination signal RSA_DONE indicating that the RWW read is completed is output from the protection signal generator 210a.

The first SR latch 651 receives a pulse DP1 delayed by two delay units 611 and 612 and the first termination signal RSA_DONE, and generates a first protection signal PROTRGN1. In a state in which the first termination signal RSA_DONE is at a low level, when the delayed pulse DP1 is input, the first protection signal PROTRGN1 is activated (e.g., high level). When the first termination signal RSA_DONE goes from the low level to a high level, the first protection signal PROTRGN1 is inactivated (e.g., low level).

The second SR latch 652 receives a pulse DP2 delayed by one delay unit 611 and the first termination signal RSA_DONE, and generates a second protection signal PROTRGN2. As described above with reference to FIG. 10, the second protection signal PROTRGN2 is activated longer than the first protection signal PROTRGN1 by an additional time (e.g., the data dump period).

The check signal generator 210b includes multiple delay units 621, 622, 623 and 624, multiple delay units 631, 632 and 633, multiple flipflops 641, 642 and 643, multiple operation units 661, 662 and 663. A second pulse WSAPL formed based on the RMW read command is input to the check signal generator 210b and a second termination signal WSA_DONE indicating that the RMW read is completed is output from the check signal generator 210b.

The delay unit 621 delays the second pulse WSAPLS to generate the first check signal CHK1. The first check signal CHK1 may correspond to a second AMP operation start time of the second read circuit 210_2. The flipflop 641 transmits the first protection signal PROTRGN1 in response to the first check signal CHK1.

The operation unit 661 performs a first checking process to determine whether the first check signal CHK1 overlaps with the first protection signal PROTRGN1. In the depicted embodiment, the operation unit 661 includes an inverter, two AND gates, and an OR gate, although other configurations may be incorporated.

A signal (tXing delayed by the delay unit 631), the first protection signal PROTRGN1 and the first termination signal RSA_DONE are input to the operation unit 661. When the first protection signal PROTRGN1 is inactivated (e.g., low level), an output signal C1 of the operation unit 661 is activated (e.g., high level). Conversely, when the first protection signal PROTRGN1 is activated (e.g., high level), the output signal C1 of the operation unit 661 is maintained in an inactivated state (e.g., low level). Meanwhile, when the first termination signal RSA_DONE in the activated state (e.g., high level) is input, the output signal C1 is activated (e.g., high level).

If the output signal C1 is activated, the sense AMP control signal PSA is activated using the output signal C1. That is, a data sensing operation of the second read operation may be performed. When the output signal C1 is inactivated, the data sensing operation may not be performed.

Similarly, the delay unit 622 delays the output signal C1 and generates a second check signal CHK2. The second check signal CHK2 may correspond to a second MUX operation start time of the second read circuit 210_2. The flipflop 642 transmits the first protection signal PROTRGN1 in response to the second check signal CHK2.

The operation unit 662 performs a second checking process to determine whether the second check signal CHK2 overlaps with the first protection signal PROTRGN1. In the depicted embodiment, the operation unit 662 includes an inverter, two AND gates, and an OR gate, although other configurations may be incorporated.

A signal (tXing delayed by the delay unit 632), the first protection signal PROTRGN1 and the first termination signal RSA_DONE are input to the operation unit 662. When the first protection signal PROTRGN1 is inactivated, an output signal C2 of the operation unit 662 is activated. Conversely, when the first protection signal PROTRGN1 is activated, the output signal C2 of the operation unit 662 is maintained in an inactivated state. Meanwhile, when the first termination signal RSA_DONE in the activated state is input, the output signal C2 is activated.

If the output signal C2 is activated, the MUX control signal PMUX is activated using the output signal C2. In such a manner, the MUX of the second read operation may operate. When the output signal C2 is inactivated, the MUX may not operate.

In summary, when the first check signal CHK1 and the second check signal CHK2 overlap with the first protection signal PROTRGN1, the second read circuit 210_2 stops the second read operation, and after the first read operation is completed, the second read operation may be resumed.

In addition, the delay unit 623 delays the output signal C2 and generates the third check signal CHK3. The third check signal CHK3 corresponds to a data dump period of the second read circuit 210_2. The flipflop 643 transmits the second protection signal PROTRGN2 in response to the third check signal CHK3.

The operation unit 663 performs a third checking process to determine whether the third check signal CHK3 overlaps with the second protection signal PROTRGN2. The operation unit 663 includes an inverter, two AND gates, and an OR gate, although other configurations may be incorporated.

A signal (tXing delayed by the delay unit 633), the second protection signal PROTRGN2 and the first termination signal RSA_DONE are input to the operation unit 663. When the second protection signal PROTRGN2 is inactivated, an output signal C3 of the operation unit 663 is activated. Conversely, when the second protection signal PROTRGN2 is activated, the output signal C3 of the operation unit 663 is maintained in an inactivated state. Meanwhile, when the first termination signal RSA_DONE in the activated state is input, the output signal C3 is activated.

If the output signal C3 is activated, the data dump signal DATADUMP is activated using the output signal C3. In such a manner, the data dump operation of the second read operation may occur. When the output signal C3 is inactivated, the data dump operation does not occur.

In summary, when the third check signal CHK3 overlaps with the second protection signal PROTRGN2, the second read circuit 210_2 stops the second read operation, and after the first read operation is completed, the second read operation may be resumed.

The delay unit 624 delays the output signal C3 and generates the second termination signal WSA_DONE.

Figure 12:
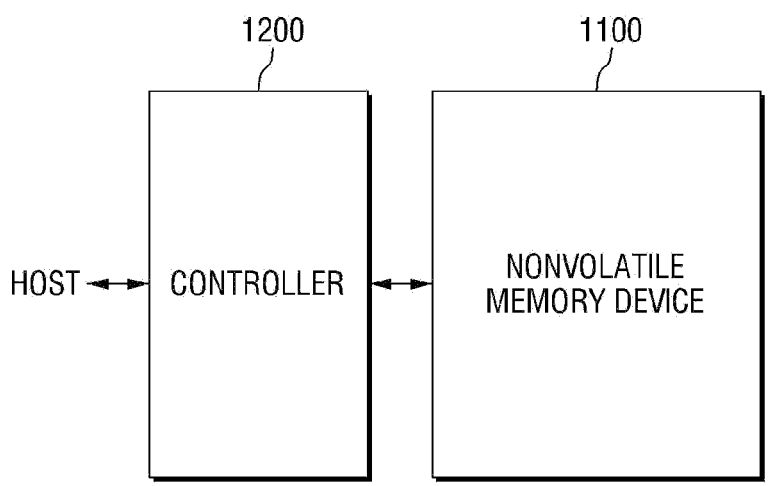
FIG. 12 is a block diagram of a nonvolatile memory system, according to embodiments of the inventive concept.

FIG. 12 is a block diagram of a nonvolatile memory system, according to embodiments of the inventive concept.

Referring to FIG. 12, nonvolatile memory system 1000 includes a nonvolatile memory device 1100 and a controller 1200. The nonvolatile memory device 1100 may be configured and driven in the same manner described above with reference to FIGS. 1 to 11. The controller 1200 is connected to a host and the nonvolatile memory device 1100.

The controller 1200 is configured to access the nonvolatile memory device 1100 in response to requests from the host. For example, the controller 1200 may control read, write, erase, and background operations of the nonvolatile memory device 1100. The controller 1200 provides interfacing between the nonvolatile memory device 1100 and the host. The controller 1200 may drive firmware for controlling the nonvolatile memory device 1100.

For example, the controller 1200 may include well-known components, such as random access memory (RAM), a processing unit, a host interface, a memory interface, and the like. The RAM may be used as at least one of operating memory of the processing unit, cache memory between the nonvolatile memory device 1100 and the host, and buffer memory between the nonvolatile memory device 1100 and the host. The processing unit controls the overall operation of the controller 1200.

The host interface includes a protocol for exchanging data and/or commands between the host and the controller 1200. For example, the controller 1200 may be configured to communicate with an external device (host) through one of various interface protocols, such as universal serial bus (USB), multimedia card (MMC), peripheral component interconnection (PCI) protocol, PCI-express (PCI-E) protocol, advanced technology electronics (ATA) protocol, serial-ATA protocol, parallel-ATA protocol, small computer small interface (SCSI) protocol, enhanced small disk interface (ESDI) protocol, and integrated drive electronics (IDE) protocol. The memory interface interfaces with the nonvolatile memory device 1100. Here, the memory interface may include, for example, a NAND interface or a NOR interface.

The memory system 1000 may further include an error correction block. The error correction block may be configured to detect and correct errors in data stored in the memory system 1100 using an error correction code (ECC). For example, the error correction block may be provided as a component of the controller 1200. Alternatively or in addition, the error correction block may be provided as a component of the nonvolatile memory device 1100.

The controller 1200 and the nonvolatile memory device 1100 may be integrated into one semiconductor device. For example, the controller 1200 and the nonvolatile memory device 1100 may be integrated into one semiconductor device to form a memory card. For example, the controller 1200 and the nonvolatile memory device 1100 may be integrated into one semiconductor device to form a Multi Media Card (MMC, RS-MMC, MMCmicro), a Secure Digital card (SD, miniSD, microSD), a Universal Flash Storage (UFS), a PC card (originally PCMCIA or PCMCIA card), a Compact Flash (CF) card, a Smart Media (SM) Card, a memory stick, and the like, but are not limited thereto.

As another example, the controller 1200 and the nonvolatile memory device 1100 may be integrated into one semiconductor device to form a Solid State Disk/Drive (SSD). The SSD includes a storage device configured to store data in a semiconductor memory. When the memory system 1000 is used as an SSD, the operating speed of the host connected to the memory system 1000 may be significantly improved.

As another example, the memory system 1000 may include or be incorporated in a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional television, a digital audio recorder, a digital audio player, a digital picture recorder, a digital picture player, digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded systems, but is not limited thereto.

As an example, the nonvolatile memory device 1100 and/or the memory system 1000 may be packaged in a variety of ways. For example, the nonvolatile memory device 1100 and/or the memory system 1000 may be mounted in a package on package (PoP), a ball grid array (BGA) package, a chip scale package (CSP), a plastic leaded chip carrier (PLCC), a plastic dual in-line package (PDIP), a die in waffle pack, a die in wafer form, a chip-on-board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP) or a wafer-level processed stack package (WSP), but is not limited thereto.

Figure 13:
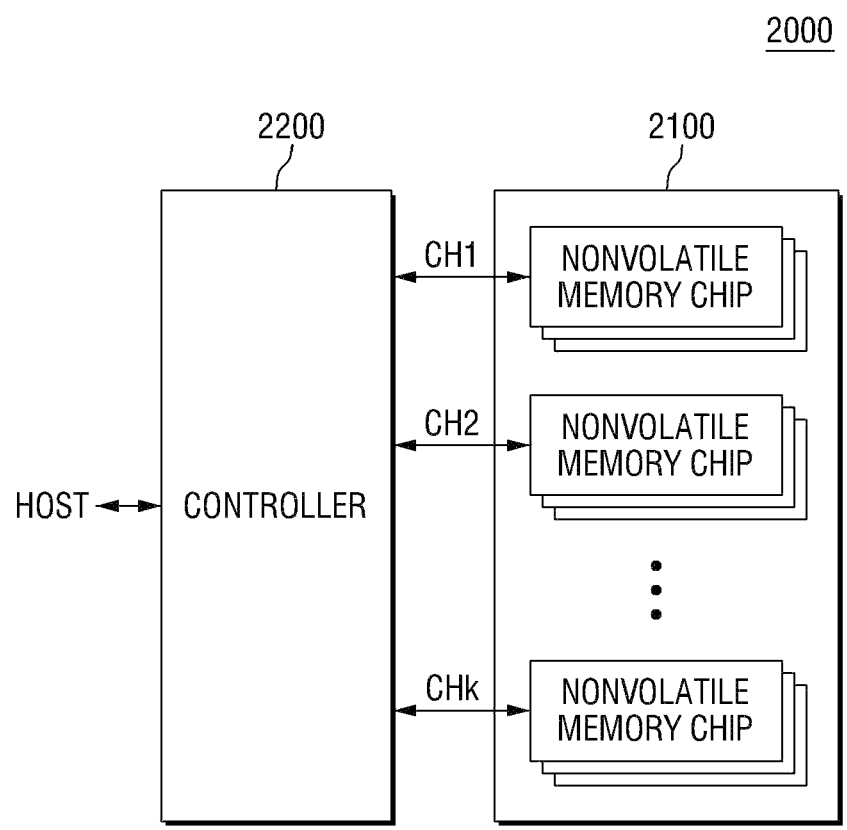
FIG. 13 is a block diagram illustrating an exemplary application of the memory system shown in FIG. 12, according to embodiments of the inventive concept.

FIG. 13 is a block diagram illustrating an exemplary application of the memory system shown in FIG. 12, according to embodiments of the inventive concept.

Referring to FIG. 13, memory system 2000 includes nonvolatile memory 2100 and a controller 2200. The nonvolatile memory 2100 includes multiple nonvolatile memory chips. The nonvolatile memory chips are divided into groups, where each group of the nonvolatile memory chips is configured to communicate with the controller 2200 through a common channel. For example, the nonvolatile memory chips may communicate with the controller 2200 through first to kth channels CH1 to CHk. Each of the nonvolatile memory chips is configured in substantially the same manner as the nonvolatile memory 100 discussed above with reference to FIGS. 1 to 11.

While multiple nonvolatile memory chips (in a group) are exemplarily shown connected to one channel in FIG. 13, it is understood by one skilled in the art that the memory system 2000 may be modified to connect each nonvolatile memory chip to one channel.

Figure 14:
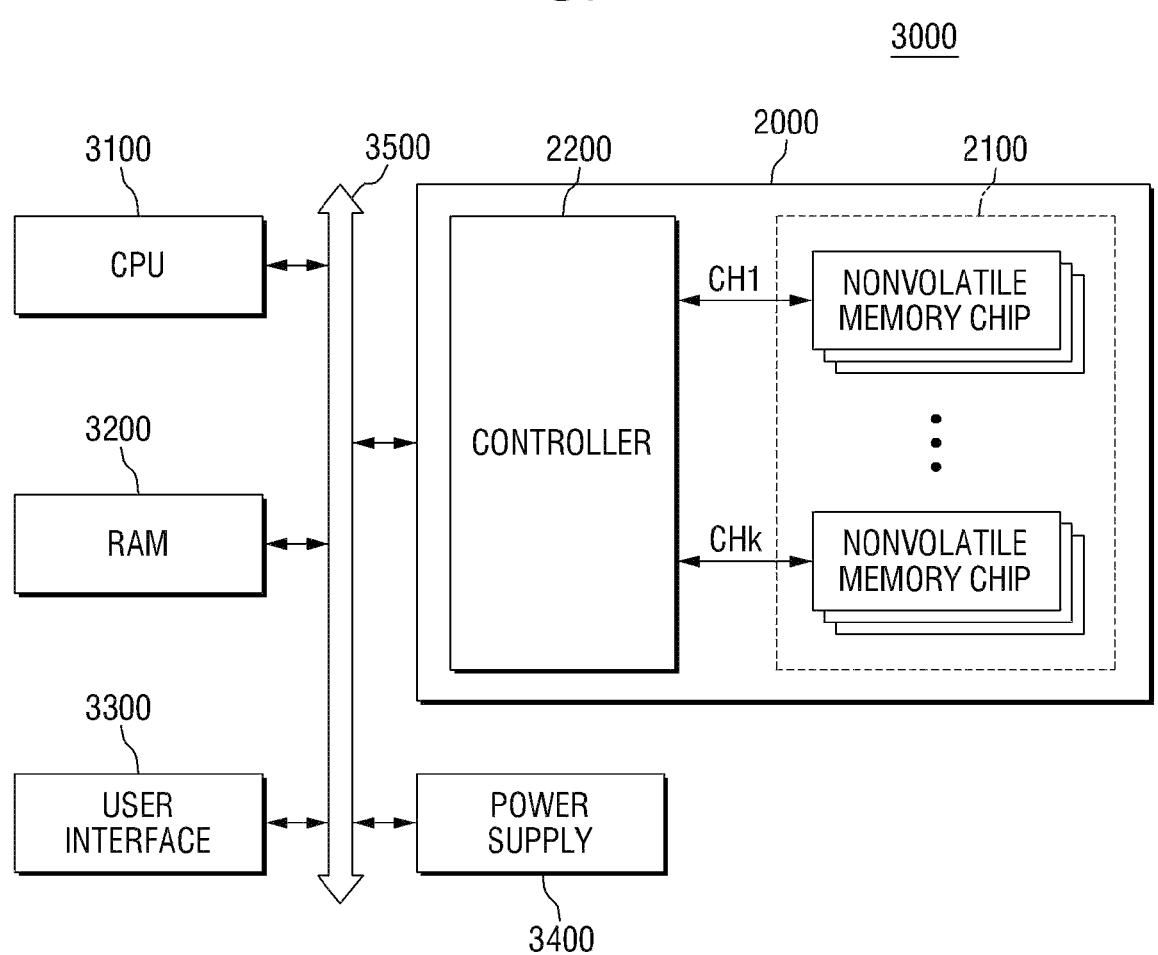
FIG. 14 is a block diagram illustrating a computing system, including the memory system shown in FIG. 13, according to embodiments of the inventive concept.

FIG. 14 is a block diagram illustrating a computing system, including the memory system shown in FIG. 13, according to embodiments of the inventive concept.

Referring to FIG. 14, computing system 3000 includes a central processing unit (CPU) 3100, random access memory (RAM) 3200, a user interface 3300, a power supply 3400, and the memory system 2000.

The memory system 2000 may be electrically connected to the CPU 3100, the RAM 3200, the user interface 3300 and the power supply 3400 through a system bus 3500. The data supplied through the user interface 3300 or processed by the CPU 3100 may be stored in the memory system 2000.

In FIG. 14, the nonvolatile memories 2100 are connected to the system bus 3500 through the controller 2200. However, in alternative configurations, the nonvolatile memories 2100 may be directly connected to the system bus 3500.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A nonvolatile memory device, comprising:
   a memory array including a plurality of nonvolatile memory cells;
   a first read circuit configured to read first data from the memory array during a first read operation and to provide one or more protection signals indicating a victim period during the first read operation; and
   a second read circuit configured to read second data from the memory array during a second read operation and to provide one or more check signals indicating an aggressor period during the second read operation.

2. The nonvolatile memory device of claim 1, wherein when the one or more check signals overlap with the one or more protection signals, the second read circuit stops the second read operation.

3. The nonvolatile memory device of claim 1, wherein the first read operation is a read while write (RWW) operation and the second read operation is a read modification write (RMW) operation.

4. The nonvolatile memory device of claim 1, wherein the second read circuit is configured to perform the second read operation when all of the one or more protection signals are inactivated in response to checking the one or more protection signals with the one or more check signals.

5. The nonvolatile memory device of claim 1, wherein the victim period includes at least a portion of a bitline precharge period of the first read circuit.

6. The nonvolatile memory device of claim 1, wherein the victim period includes an operation start time of a first sense amplifier of the first read circuit.

7. The nonvolatile memory device of claim 1, wherein the victim period includes at least a portion of a data dump period of the first read circuit.

8. The nonvolatile memory device of claim 1, wherein the aggressor period includes an operation start time of a second sense amplifier of the second read circuit.

9. The nonvolatile memory device of claim 1, wherein the aggressor period includes an operation start time of a second multiplexer of the second read circuit.

10. The nonvolatile memory device of claim 1, wherein the aggressor period includes a data dump period of the second read circuit.

11. The nonvolatile memory device of claim 1, wherein the one or more protection signals include a first protection signal activated for a first time and a second protection signal activated for a second time longer than the first time by an additional time, the additional time corresponding to a data dump period.

12. The nonvolatile memory device of claim 11, wherein the one or more check signals include a first check signal corresponding to an operation start time of a second sense amplifier of the second read circuit, a second check signal corresponding to an operation start time of a second multiplexer of the second read circuit and a third check signal corresponding to a data dump period of the second read circuit.

13. The nonvolatile memory device of claim 12, wherein a first checking process is performed to check whether the first check signal overlaps with the first protection signal, a second checking process is then performed to check whether the second check signal overlaps with the first protection signal, and then a third checking process is performed to check whether the third check signal overlaps with the second protection signal.

14. The nonvolatile memory device of claim 12, wherein when the first check signal or the second check signal overlaps with the first protection signal, the second read circuit stops the second read operation, and wherein the second read operation resumes after the first read operation is terminated.

15. The nonvolatile memory device of claim 12, wherein when the third check signal overlaps with the second protection signal, the second read circuit stops the second read operation, and wherein the second read operation resumes after the first read operation is terminated.

16. A nonvolatile memory device comprising:
   a memory array including a plurality of nonvolatile memory cells;
   a first read circuit configured to read first data from the memory array to perform a read while write (RWW) operation; and
   a second read circuit configured to read second data from the memory array to perform a read modification write (RMW) operation, wherein the second read circuit stops the RMW operation while the first read circuit performs one of a bitline precharge of the RWW operation, a sense amplifier operation start, and a data dump.

17. The nonvolatile memory device of claim 16, wherein the RMW operation resumes after the RWW operation is terminated.

18. A nonvolatile memory device, comprising:
   a first read circuit configured to read first data from memory cells having variable resistive materials during a first read operation and to generate at least one protection signal indicating a victim period during the first read operation, the first read circuit comprising:
      a first precharge circuit for precharging a sensing node electrically connected to a memory cell to a predetermined level during a bitline precharge period;
      a first sense amplifier for comparing levels of the sensing node and a set reference voltage, the first sense amplifier being enabled by a first sense amplifier control signal; and
      a first multiplexer for outputting an output signal of the first sense amplifier as data, the first multiplexer being enabled by a first multiplexer control signal, wherein the victim period includes at least one of a portion of the bitline precharge period, an activation of the first sense amplifier control signal, and a portion of a data dump period activated in response to the first multiplexer control signal.

19. The nonvolatile memory device of claim 18, further comprising:
   a second read circuit configured to read second data from the memory cells having variable resistive materials during a second read operation and to generate at least one check signal indicating an aggressor period during the second read operation, the second read circuit comprising:
      a second sense amplifier for comparing levels of a sensing node and a set reference voltage, the second sense amplifier being enabled by a second sense amplifier control signal; and
      a second multiplexer for outputting an output signal of the second sense amplifier as data, the second multiplexer being enabled by a second multiplexer control signal, wherein the aggressor period includes at least one of first noise generated at an operation start time of the second sense amplifier, second noise generated at an operation start time of the second multiplexer, and third noise generated during a data dump period activated in response to the second multiplexer control signal.

20. The nonvolatile memory device of claim 19, wherein the second read circuit stops the second read operation when it is determined that the at least one protection signal generated by the first read circuit overlaps with the at least one check signal generated by the second read circuit.

* * * * *